United States Patent [19]

Werner, Jr. et al.

[11] Patent Number: 5,488,301
[45] Date of Patent: Jan. 30, 1996

[54] ELECTROSTATIC VOLTMETER EMPLOYING A DIFFERENTIAL CASCODE

[75] Inventors: Alan J. Werner, Jr., Rochester, N.Y.; Mohamad M. Mojaradi, Los Angeles, Calif.; Mehrdad Zomorrodi, West Hills, Calif.; Steven A. Buhler, Redondo Beach, Calif.; Tuan A. Vo, Hawthorne, Calif.

[73] Assignee: Xerox Corporation, Stamford, Conn.

[21] Appl. No.: 359,170

[22] Filed: Dec. 19, 1994

[51] Int. Cl.⁶ ................................................ G01R 21/12
[52] U.S. Cl. ............................ 324/458; 324/109; 324/72; 324/457; 355/216
[58] Field of Search .................................. 324/457, 458, 324/72, 452, 109; 355/216

[56] References Cited

U.S. PATENT DOCUMENTS

| | | | |
|---|---|---|---|
| 3,644,828 | 2/1972 | Gathman | 324/123 R |
| 3,667,036 | 5/1972 | Searchman | 324/72 |
| 3,852,667 | 12/1974 | Williams et al. | 324/72 |
| 3,921,087 | 11/1975 | Vosteen | 330/2 |
| 4,027,240 | 5/1977 | Meade | 324/110 |
| 4,061,983 | 12/1977 | Suzuki | 330/207 P |
| 4,063,154 | 12/1977 | Andrus et al. | 324/32 |
| 4,149,119 | 4/1979 | Buchheit | 324/32 |
| 4,330,749 | 5/1982 | Eda et al. | 324/457 |
| 4,370,615 | 1/1983 | Whistler | 324/457 |
| 4,673,885 | 6/1987 | Lewiner et al. | 324/457 |
| 4,797,620 | 1/1989 | Williams | 324/458 |
| 4,804,922 | 2/1989 | Sometani et al. | 324/457 |
| 4,853,639 | 8/1989 | Vosteen et al. | 324/457 |
| 4,868,907 | 9/1989 | Folkins | 323/231 |
| 4,878,017 | 10/1989 | Williams | 324/109 |
| 4,973,910 | 11/1990 | Wilson | 324/457 |
| 5,065,102 | 11/1991 | Takanashi et al. | 324/452 |
| 5,204,636 | 4/1993 | Werner, Jr. et al. | 330/85 |
| 5,212,451 | 5/1993 | Werner, Jr. | 324/458 |
| 5,270,660 | 12/1993 | Werner, Jr. et al. | 324/457 |
| 5,323,115 | 6/1994 | Werner, Jr. | 324/457 |
| 5,329,155 | 7/1994 | Lao et al. | 257/538 |

FOREIGN PATENT DOCUMENTS

| | | |
|---|---|---|
| 0274995 | 7/1988 | European Pat. Off. . |
| 2450461 | 9/1980 | France . |
| 62-90564 | 4/1987 | Japan . |

Primary Examiner—Kenneth A. Wieder
Assistant Examiner—Jose M. Solis
Attorney, Agent, or Firm—Duane C. Basch

[57] ABSTRACT

An electrostatic voltmeter suitable for use in a non-contacting, positive or negative potential sensing, type electrostatic voltmeter. The invention enables a flexible, low cost electrostatic voltmeter to be produced using high-voltage field-effect transistors in the circuit design. The invention further includes input conditioning components that enable high-voltage sensing and high-voltage feedback in such a manner that processing of the input signal from the sensor is accomplished without producing a variation in the current passing through the field-effect transistor in response to voltage variations. Elimination of this variation further reduces the susceptibility of the remaining signal processing circuitry to transient direct current signals. A differential cascode as the input stage is the preferred configuration for the input conditioning components.

12 Claims, 4 Drawing Sheets

ELECTROSTATIC VOLTMETER EMPLOYING A DIFFERENTIAL CASCODE

This invention relates generally to the measurement of electrostatic potentials, and more particularly to an apparatus for conditioning an input signal in a manner that enables a non-contacting electrostatic voltmeter (ESV) to reliably measure an electrostatic potential.

CROSS REFERENCE

The following related patent and application hereby incorporated by reference for their teachings:

"Electrostatic Voltmeter Producing a Low Voltage Output," A. Werner Jr., U.S. Pat. No. 5,323,115, issued Jun. 21, 1994.

"Balanced Beam Electrostatic Voltmeter Modulator Employing a Shielded Electrode and Carbon Fiber Conductors," by A. Werner Jr., application No. 08/237,819, filed May 9, 1994.

BACKGROUND OF THE INVENTION

The present invention is a device capable of measuring electrostatic potentials over the range of about 0 to −1000 volts with an absolute error of less than 5 volts and with insignificant current flow into the input of the device. Generally, such devices include a probe or sensor assembly working in conjunction with an associated voltmeter assembly which receives the signals from the probe and produces an output signal. Subsequently, the output signal may be used to drive an indicator, or to control an electrostatic process as a function of the measured electrostatic potential. The outputs signal must represent the maximum of minimum voltage measured and be responsive so as to produce a full scale change in less than 10 milliseconds. Thus, the features of the present invention may be used in an electroreprographic system to control a xerographic process. These electrostatic voltmeters, or ESVs, are particularly well suited for measuring photoreceptor surface charge, which in turn allows for the automated adjustment of machine characteristics to achieve high quality reprographic output.

Heretofore, it has been recognized that, in a non-contacting ESV, the sensing probe or electrode should be modulated with respect to the field being measured in order to accurately measure the field. Moreover, two methods of achieving the required modulation of the electrode are known, the first requiring a stationary electrode and a vibrating element, or vane, to modulate the field which reaches the electrode, as described by U.S. Pat. No. 3,921,087 to Vosteen (issued Nov. 18, 1975), or by U.S. Pat. No. 4,149,119 to Buchheit (issued Apr. 10, 1979). The second approach utilizes a moving electrode, affixed to the end of a vibrating element as disclosed in U.S. Pat. No. 3,852,667 to Williams et al. (issued Dec. 3, 1974), or alternatively as disclosed in U.S. Pat. No. 5,212,451 to Werner (issued May 18, 1993).

Moreover, numerous approaches are recognized to process the signal produced by the sensing electrode, thereby enabling the measurement of the electrostatic field potential. Some signal processing approaches are illustrated in the following disclosures which may be relevant:

U.S. Pat. No. 3,644,828 to Gathman (issued Feb. 22, 1972) teaches a direct-current high-voltage electrometer for measuring potentials, where the a high-input impedance is provided by a guard voltage supplied by a charged capacitor.

U.S. Pat. No. 3,667,036 to Seachman (issued May 30, 1972) discloses electrometer amplifier circuits for measuring the potential of the electrostatic charge formed on an insulating surface. The circuit includes a probe assembly consisting of probe and guard electrodes. The output of the probe electrode is connected to a high impedance circuit which comprises a Metal Oxide Field Effect Transistor (MOS FET) in a source-follower configuration.

U.S. Pat. No. 4,027,240 to Meade (issued May 31, 1977) discloses a voltmeter used in detecting an electronic voltage signal in an ordinance firing circuit, where the voltmeter is protected by a pair of back-to-back parallel-connected limiting diodes. A first limiter is used to reduce the amplitude of the detected signal, while the second limiter prevents overloading of an indicator.

U.S. Pat. No. 4,061,983 to Suzuki (issued Dec. 6, 1977) discloses a transistor amplifier including a bipolar transistor supplied with an input signal and a field effect transistor (FET) which is directly connected to an output electrode of the bipolar transistor to amplify the applied signal. A protective circuit senses the load impedance and activates a voltage signal which ultimately results in the lowering of the gate potential on the FET to prevent the FET from damage.

U.S. Pat. No. 4,063,154 to Andrus et al. (issued Dec. 13, 1977) discloses a feedback circuit for the probe of a direct-current electrostatic voltmeter to reduce the spacing sensitivity thereof.

U.S. Pat. No. 4,149,119 to Buchheit (issued Apr. 10, 1979) teaches an electrostatic voltmeter or electrometer which includes a probe sensor for sensing electrostatic charge present on a test surface. The probe sensor is modulated using a rotating vane or shutter arrangement. The probe is also conditioned to receive both A.C. and D.C. signals which are amplified by a D.C. amplifier, where the A.C. signal from the probe is fed back to the D.C. amplifier to stabilize its output.

U.S. Pat. No. 4,330,749 to Eda et al. (issued May 18, 1982) teaches an electrometer apparatus for measuring the electrostatic potential on the surface of a photoconductive drum. The apparatus consists of an electrode which is placed near the surface on which the electrostatic potential is to be measured. A potential proportional to the surface potential is induced in the electrode and applied to the input of an amplifier with high input impedance. The amplifier has a MOS FET input stage with a high input impedance and a low bias current.

U.S. Pat. No. 4,673,885 to Lewiner et al. (issued Jun. 16, 1987) teaches a device for reading the quantity of electrical charge borne by a dielectric sheet, where a probe is used to scan the surface of the sheet. The probe is in turn connected to a circuit adapted to measure the charge induced on the probe.

U.S. Pat. No. 4,853,639 to Vosteen et al. (issued Aug. 1, 1989) discloses a non-contacting type electrometer apparatus for monitoring the electric potential of a test surface. A sensing integrator is used in conjunction with a pre-amp and a high-gain operational amplifier (opamp) to provide an improved high-frequency response.

U.S. Pat. No. 4,797,620 to Williams (issued Jan. 10, 1989) discloses a non-contacting electrostatic detector which eliminates the use of high-voltage circuitry in non-space dependent, high-voltage electrostatic monitoring devices. An A.C. voltage, having the same frequency as the modulator frequency, is used to produce a zero net current flow, so that the magnitude and phase of the output signal are proportional to the magnitude and polarity of the electrostatic potential being monitored.

U.S. Pat. No. 4,804,922 to Sometani et al. (issued Feb. 14, 1989) and U.S. Pat. No. 4,868,907 to Folkins (issued Sep. 19, 1989) both disclose devices which proportionally convert electrostatic voltage into current.

U.S. Pat. No. 4,878,017 to Williams (issued Oct. 31, 1989) teaches a non-contacting electrostatic voltage follower having a response speed independent of the frequency of modulation of the capacitance or electrostatic field between a detector electrode and the measured surface. The voltage follower is capable of following both static and dynamic characteristics of an external field or potential to be measured.

U.S. Pat. No. 4,973,910 to Wilson (issued Nov. 27, 1990) teaches an electrostatic analyzer that incorporates a field effect transistor (FET) as a sensor used to convert electrostatic voltage into a proportional current. The sensor is described as a semiconductive device having n-p-n junctions. In operation, a zero-field reference is used to alter the base potential of the sensor, thus forming a zero-field condition. The surface potential difference is then determined as a function of the sensor base voltage, which is directly measured by a voltmeter.

U.S. Pat. No. 5,065,102 to Takanashi et al. (issued Nov. 12, 1991) teaches an apparatus for detecting the distribution of electric surface potential in a device employing a low voltage field effect transistor in the sensing device. Inaccuracy resulting from the field effect transistor are overcome by subjecting the gate of the transistor to an electrostatically induced voltage corresponding to the surface potential being measured, and periodically shunting the gate of the transistor to ground in response to a reset pulse.

FR-A-2 450 461 by Mettier (published Sep. 26, 1980) illustrates a circuit for the detection of electrostatic charge.

The Kumada publication (JA-62-90564), published Apr. 25, 1987, illustrates a circuit for measuring surface potential, including an independent power source which provides power to an impedance converter circuit which is separated from a signal processing circuit.

EP-A-0 274 995 by Chieli (published Jul. 20, 1988) teaches a circuit for the linear measurement of current through a load, where a pair of field effect transistors are interconnected to form a current mirror.

In operation, the electrostatic voltmeter described in U.S. Pat. No. 5,323,115 and in U.S. Pat. No. 5,270,660 to Werner, Jr. et al. issued Dec. 14, 1993, both hereby incorporated be reference, attempts to "follow" a changing input signal where the finite transconductance of a field-effect transistor (FET) employed in an electrostatic voltmeter produces a variation in the current passing through the FET in response to a voltage variation across the FET. This variation can also produce a transient direct-current signal into a coupling capacitor used in the circuitry to process the input signal. The gate-to-source resistance of the high-voltage MOS FET is large in order to generate as large a gate-source modulation voltage as possible. The drain-to-gate capacitance feeds into the "resistor" and while the capacitance is small (typically about 20 fF) the voltage changes generate sufficient current through the capacitance to generate a potential from gate-to-source capable of driving the FET out of the normal operating range. Lastly, as a result of imperfect modulation, the modulator is a capacitance coupling (between the ESV circuit and the photoreceptor surface being characterized) applied directly into the gate of the high-voltage MOS FET. Any transient DC changes on the surface being characterized are fed directly to the gate; this can also drive the FET out of the normal operating range. Although the more efficient the voltmeter modulation is the more less serious the transient problem becomes, there is still a processing burden on the circuits employed for AC/DC separation. Accordingly, the present invention is intended to resolve the current variation and transient direct-current signal problems noted above by shunting large current variations into the common substrate node found in an FET and, specifically, by employing a high-voltage differential cascode MOS FET pair as will be described in further detail.

In accordance with the present invention, there is provided an apparatus for generating a low voltage signal proportional to an electrostatic potential on a surface, comprising:

a non-contacting sensor for producing an input signal representative of the electrostatic potential on the surface;

a high-voltage source adapted to produce a first potential of first polarity;

a high-voltage level shifting circuit, powered by said high-voltage source and including an input conditioning circuit for reducing transient variations in the input signal produced by said sensor, said high-voltage level shifting means generating a first signal referenced to ground in response to the conditioned input signal output from the input signal conditioning circuit; and a circuit, connected to receive the first signal from said high-voltage level shifting means, for converting the first signal to a low voltage signal, said low voltage signal being referenced to ground potential.

Figure 1:
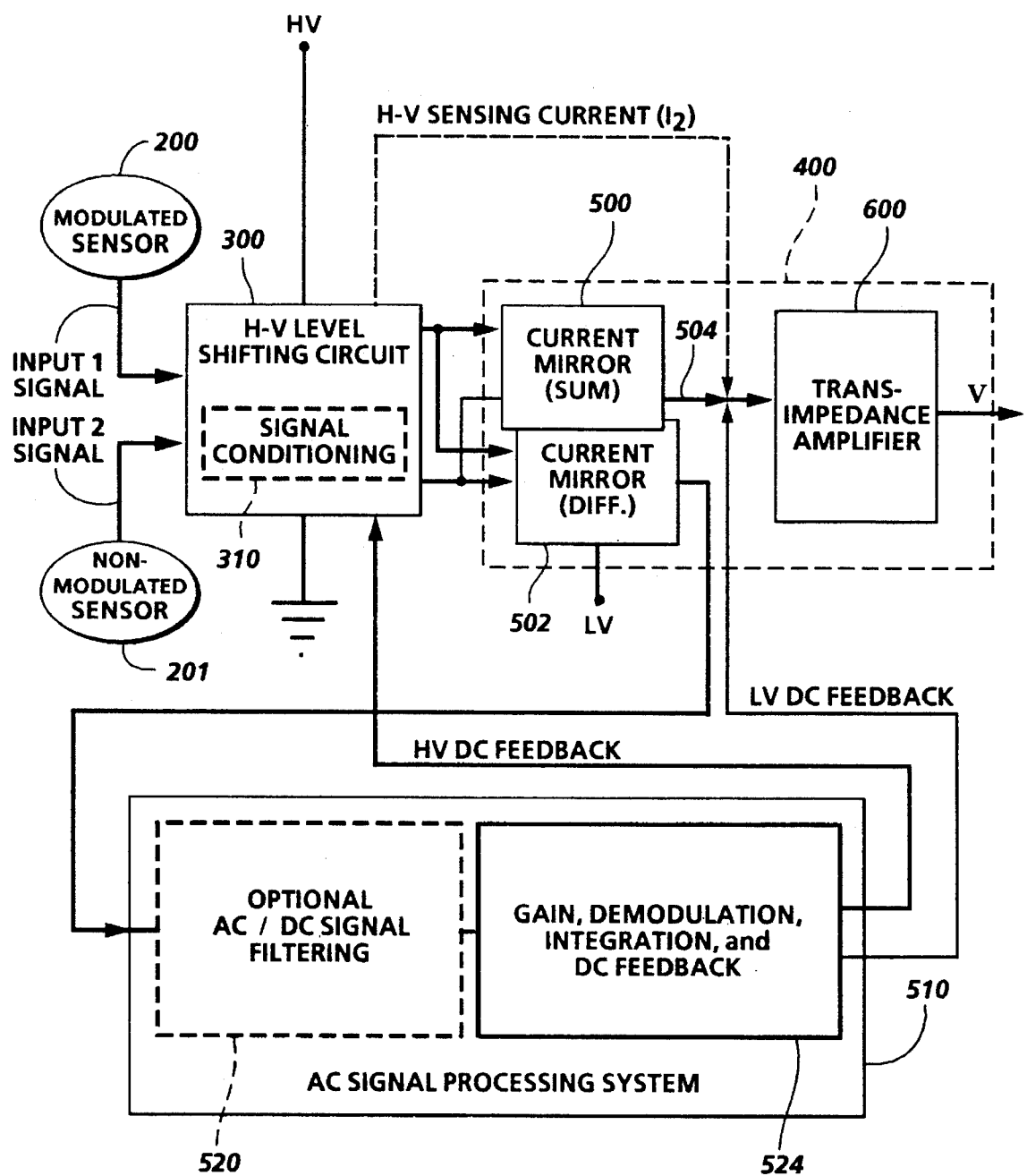
FIG. 1 is a block diagram illustrating an electrostatic voltmeter in which the present invention is employed.

The present invention will be described in connection with preferred embodiments, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the electrostatic voltmeter of the present invention, reference is made to the drawings. In the drawings, like alphanumeric references have been used throughout to designate identical elements and components.

In general, an electromechanical capacitance modulation converts the DC (direct current) difference between the voltage on a surface being characterized and the input gate of a high-voltage MOS FET into a modulated or alternating current (AC) signal. Subsequently, the AC signal is level shifted to ground by the high-voltage MOS FET and, using a current mirror, amplified, demodulated, and fed back to the source of the high-voltage MOS FET so as to drive the gate voltage of the input transistor to the same potential as the voltage on the surface being characterized. The high-voltage MOS FET input stage is a depletion mode device that may be operated with no bias voltage between the gate and the source. Thus the source voltage of the high-voltage MOS FET is also driven to the same potential as that on the surface; where a measurement of the high-voltage MOS FET source potential is representative of the voltage on the surface being characterized.

FIG. 1 is a block diagram of the primary elements, or blocks, which represent the improved electrostatic voltmeter. In general, the ESV generates a low voltage electrical signal, V in response to an electric signal provided by non-contacting sensor 200, which is exposed to an electrostatic potential present on a surface (not shown), for example a photoreceptor or similar photoresponsive surface. Input signal conditioning circuit 310, within high-voltage level shifting circuit 300, is connected to receive the electric signals, INPUT1 and INPUT2, from modulating sensor 200 and and non-modulating sensor 210, respectively, and to process the modulated signal so as to reduce transient variations therein. The current signals output by the high-voltage level shifting circuits are referenced to ground potential, and the magnitude of their sum is a measure of the surface potential. Transient variations are reduced in signal conditioning circuit 310 as a function of the non-modulated input (INPUT2) provided by sensor 201. Sensor 201 is preferably a stationary probe, rigidly affixed so that it also becomes capacitively coupled with the surface being characterized, and is appropriately sized to balance out the capacitive coupling of the modulated input from sensor 200.

Subsequently, the current signals are passed to converter 400 to be converted to low voltage electrical signal V. As illustrated in FIG. 1, the converter includes a pair of current mirrors 500 and 502, which generate sum and difference signals, respectively, before the level shifted direct current signal of line 504 is fed into transimpedance amplifier 600. Similarly, the difference or alternating current signal is output on line 506 and connected to the AC signal processing block 510. AC signal processing block generates a pair of feedback signals that are fed back to the high- and low-voltage circuits as illustrated. Using a desired transfer function, transimpedance amplifier 600 then transforms the current signal output from the summing current mirror 500, in combination with the low-voltage feedback signal and the high-voltage sensing current, into a low-voltage signal indicative of the surface potential. In one embodiment the low-voltage signal may then be used as an input by a common xerographic process control system to control the charge placed upon a photoresponsive surface. Converter 400 would preferably include two additional elements to implement the desired transfer function; a zero offset circuit (not shown), which allows the output voltage at zero volts input to be offset from zero volts; and span-adjustment circuit (not shown), which adjusts the ratio between the output voltage span and input voltage span.

In the generalized block diagram depicted in FIG. 1, it is important to recognize that numerous electrical circuits and component combinations may be employed to implement converter 400 in order to obtain a usable output voltage V. Examples include simple means such as a single resistor, to generate a voltage indicative of the input voltage and range through standard operational amplifier techniques, to replace the relatively simple current mirror and transimpedance amplifier approach. These are well known to those skilled in the art.

The circuit architecture employed in the present invention is directed to obtaining both DC and modulated (AC) signals, the signals being transmitted to ground using a high-voltage MOS FET. In order to use the AC and DC signals, they must first be separated because only the DC information is required to measure the voltage potential present on the surface of interest. Hence, the modulating signal of which the DC is a part of must be separated so that it can be amplified, demodulated and fed back. Furthermore, the modulated or AC portion of the signal received from the modulated sensor is very small compared to the DC signal levels, particularly as the system approaches null balance. Therefore, the AC signal requires a great deal of amplification and AC/DC separation is critical to prevent DC signals from driving the AC signal processing circuitry into saturation. Having described the general requirements of the improved ESV, the remaining figures will be described in detail to illustrate the components of the ESV.

Figure 2:
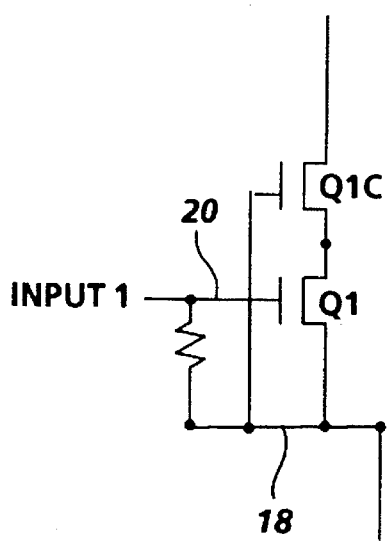
FIGS. 2, 3, and 4 are portions of electrical schematic diagrams showing methods of accomplishing a signal conditioning operation as illustrated in FIG. 1.
Figure 3:
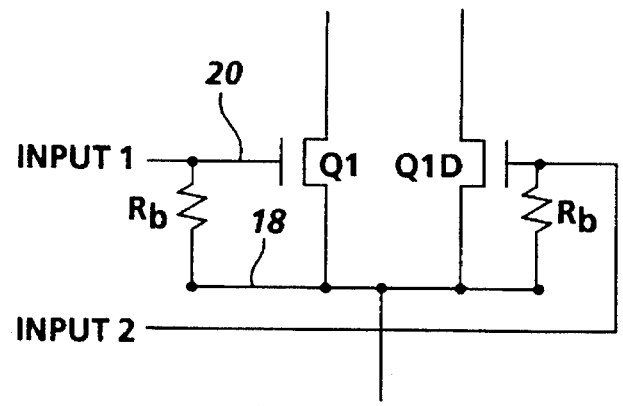
Figure 4:
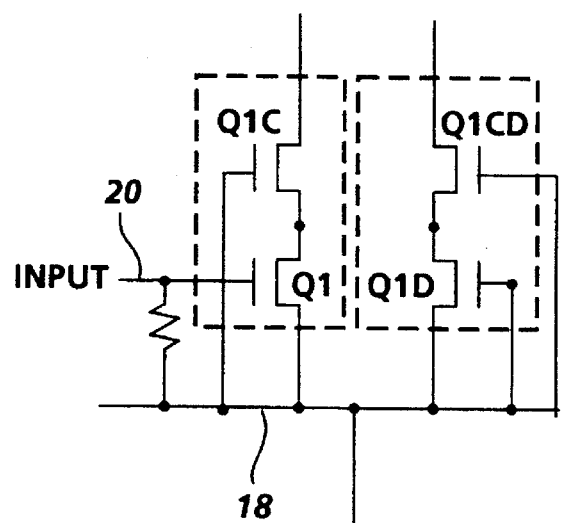

FIGS. 2, 3, and 4 are portions of simplified electrical schematics that illustrate various approaches at conditioning the input signal so as to eliminate the current variation and transient signal problems previously described. Specifically, FIG. 2 illustrates a cascode arrangement for the FETs Q1 and Q1C, where the impact of the drain-to-gate capacitance of Q1 is reduced by the addition of Q1C. Preferably the NMOS FET employed in the ESV for Q1C, is a high-voltage depletion-mode NMOS driver which operates in the range of from about 0 volts to at least 1700 volts.

FIG. 3, illustrates a differential amplifier comprised of a pair of "matched" FETs, Q1 and Q1D, where the finite transconductance of the FETs cancels out. Moreover, by applying the appropriate balancing resistors, $R_b$, and a non-modulated balancing signal (INPUT2) capacitively coupled to the surface, any transient direct-current signal generated in response to a variation in the input signal can be eliminated.

FIG. 4 shows a schematic illustration of an embodiment, combining the advantages of both of the circuits illustrated in FIGS. 2 and 3. The differential cascode amplifier circuit of FIG. 4, implemented using a combination of high-voltage NMOS FETs, Q1C and Q1CD, and low-voltage NMOS FETs, Q1 and Q1D, not only eliminates the impact of the finite transconductance, but further includes the pair of cascodes to eliminate any transient direct-current generated as a result of drain-to-gate capacitance of the high-voltage MOS FETs employed in the differential circuit.

Figure 5A:
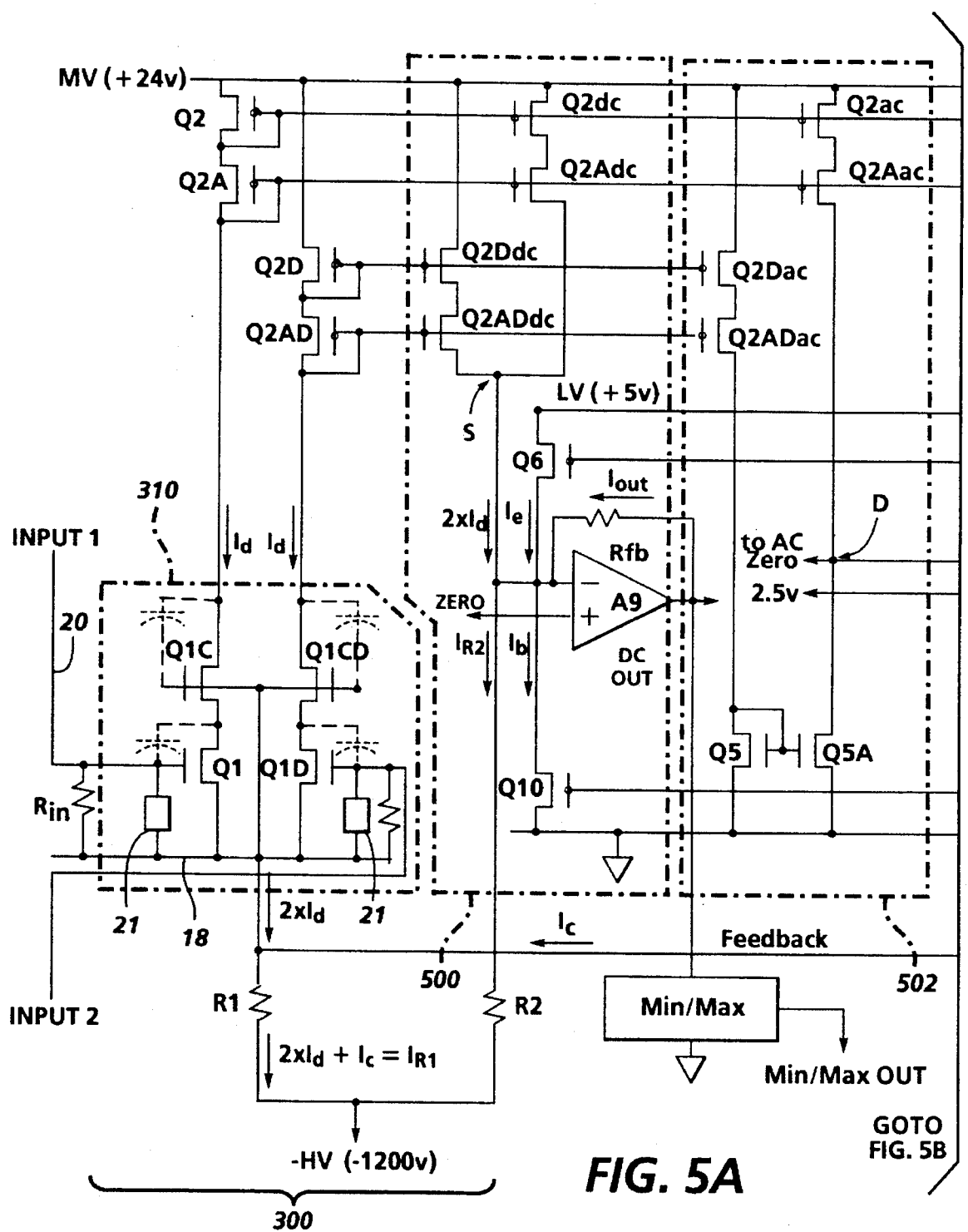
FIGS. 5A and 5B are an electrical schematic diagram illustrating the details of an electrostatic voltmeter produced in accordance with the present invention.
Figure 5B:
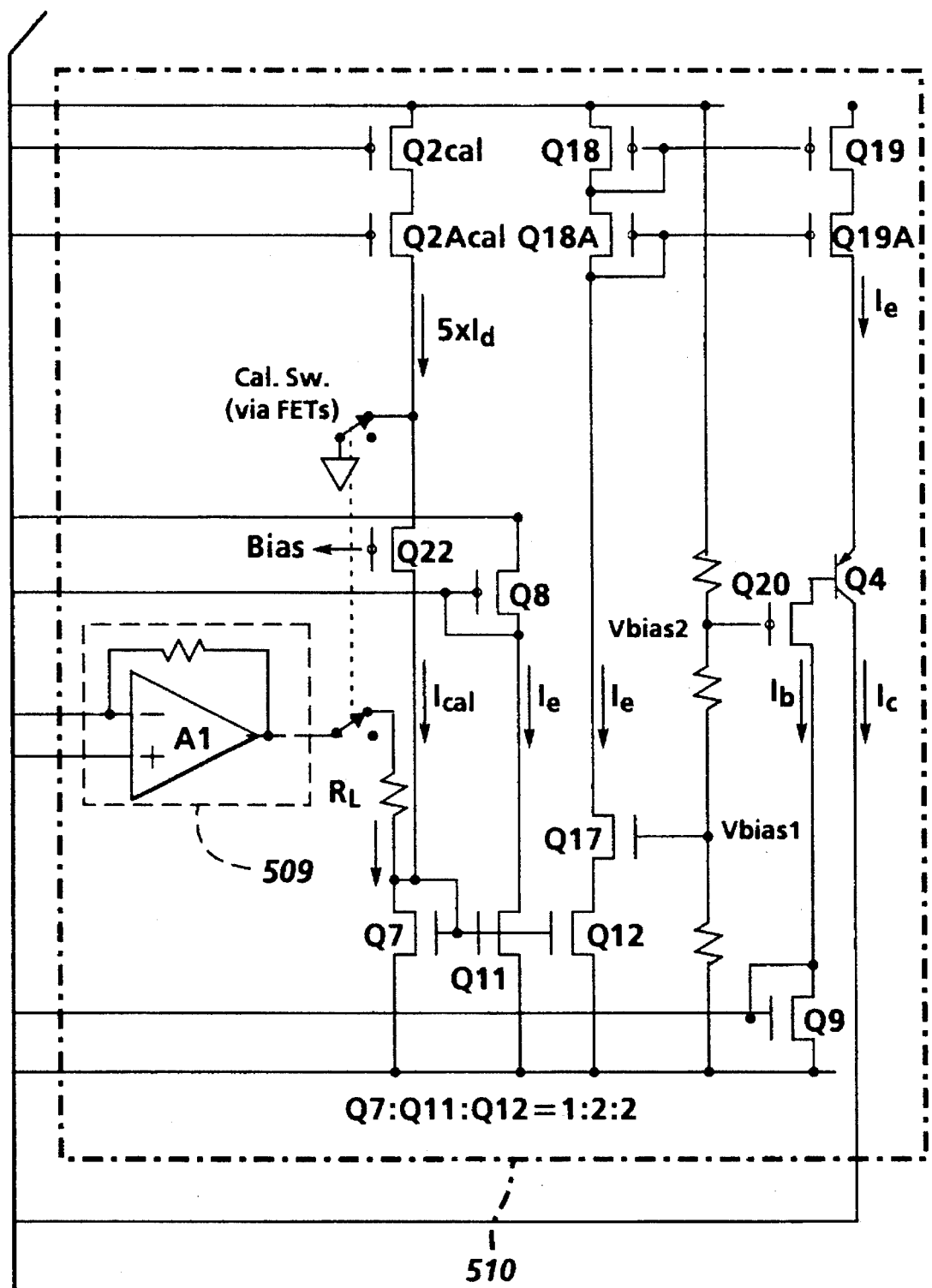

Turning now to FIGS. 5A and 5B, there is shown an embodiment of a non-contacting ESV employing the differential cascode similar to FIG. 4. As described in U.S. Pat. No. 5,323,115 to Werner, previously incorporated by reference, a non-contacting ESV differs significantly from a contacting ESV in that it uses a modulated signal generated as a function of the difference between the electrostatic potential on the surface and the voltage of the measuring electrode. Modulation may be characterized in accordance with the following equations:

$$Q=C*V \tag{1}$$

and $$I=dQ/dt=C*(dV/dt)+V*(dC/dt) \tag{2}$$

where t is time, C is the static capacitance between the modulated electrode and the surface being characterized, and dC/dt is the rate of change of the static capacitance due to electromechanical modulation. Also, V is the potential between the modulated electrode and the surface being characterized, I is the current generated into the electrical load of the modulator, and dV/dt is the modulated voltage generated into the electrical load of the modulator. In the circuit of FIGS. 5A and 5B, $R_{in}$ represents the electrical load on the modulator, and dV/dt becomes the dominant input into the gate of high-voltage MOS FET Q1C.

The modulated signal is used to generate, through proper signal processing, a DC feedback signal that drives the difference to zero. The illustrated embodiment differs significantly from other implementations in that the high-voltage level shifting circuit (block 300) supplies not only error information and DC voltage levels at an output referenced to ground potential, but it further includes the afore-described differential cascode amplifier (block 310) to reduce the impact of the finite transconductance of the FETs and to eliminate transient direct-current signals.

Preferably included with NMOS FETs Q1 and Q1D are protection devices 21 which are capable of withstanding electrostatic discharge voltages of approximately 2 KV. NMOS FETs Q1 and Q1D, and their associated protection scheme are further described in a related application for an "Integrated Linear Ultra High Voltage Device," by Mojaradi et al., application Ser. No. 08/222,356 filed Apr. 1, 1994. In the present embodiment, high-voltage resistors R1 and R2 are 7.69 MΩ resistors which are capable of operating over a voltage range of at least 0 to −1200 volts. Furthermore, R1 and R2 are purposefully designed to track one another over the range of ESV operating temperatures. Generally, the high-voltage resistors may be thin-film integrated circuit resistors as described in U.S. Pat. No. 5,329,155, by Lao et al., filed Apr. 24, 1990, the relevant portions of which are hereby incorporated by reference.

The current through resistor R1 is a measure of the voltage difference between the MOS FET source voltage and the negative high-voltage power supply (−HV), whereas the current through resistor R2 is a measure of the voltage of the high-voltage power supply. The difference between these currents represents the measure of the voltage on the surface being characterized. A series of current mirrors is used to track this current and to send an "exact" mirror of it to a low voltage transimpedance amplifier (A9) which converts the signal to a low voltage output. Accordingly, the tracking accuracy of the current mirror system is a critical parameter.

A high-voltage differential cascode MOS FET pair (shown as block 310 in FIG. 5A), is employed in the present invention in order to obtain sum and difference signals for the incoming signals. For example, summing the outputs of block 310 will give the sum of the input signals; where any input signals that are applied in-phase are additive and any signals applied out-of-phase are subtractive. Conversely, subtracting the outputs of block 310 would yield the difference between the input signals; where input signals applied in-phase are subtractive and any signals applied out-of-phase are additive. In the non-contacting ESV embodiment, only one signal is modulated. Therefore, the system is, by definition, out-of-phase.

AC/DC signal separation may be accomplished by summing the high-voltage MOS FET drain currents to get the total DC current via the Q2dc current mirror system, where the current signal at node S represents the sum or total DC current plus any AC modulation that may be present. Note that at null balance the AC signal goes to zero. Alternatively, the AC portion of the signal present at node S can be removed by simple filtering techniques well-known in the art. Similarly, the modulated or AC current signal is produced at node D via current mirror system Q2ac, where the high-voltage MOS FET drain currents are subtracted to eliminate the DC signal, leaving the AC modulation, with any transients from the surface being characterized. Importantly, DC changes due to the finite transconductance of the high-voltage MOS FETs are cancelled out by the differential action of the matched high-voltage pair Q2 and Q2D. Subsequently, as illustrated in FIGS. 5A and 5B, the AC current signal is provided to the AC signal processing system 509 in block 510 for amplification, demodulation and feedback.

In operation, a high voltage in the range of about −1200 volts is detected by the modulated sensor (ref. numeral 200, FIG. 1) and supplied to the circuit of FIGS. 5A and 5B via input line 20. NMOS FET Q1, in conjunction with high-voltage resistor R1, forms a source-follower which is the basis of the level shifting block 300 shown in FIG. 1, where the current through the source-follower is a measure of the voltage difference between the gate of Q1 (or input voltage) and the the high-voltage power supply potential, −HV. It should be noted that the embodiment depicted in FIGS. 5A and 5B is a "floating" configuration, as described in a copending application by Moiaradi et al., application Ser. No. 08/222,356 filed Apr. 1, 1994, where the high-voltage components float with the substrate potential. The high-voltage power supply, depicted by −HV, may be any suitable power supply capable of providing a potential somewhat more negative than the most negative voltage being measured but within the device ratings, about −1700 volts. Preferably, the device is operated to measure voltages in the range of −1000 to −1200 volts. The maximum current required from the high-voltage power supply is determined by the parallel resistance of R1 and R2 and is less than 500 pA for the typical operating range.

Continuing with FIGS. 5A and 5B, a 1:1 current mirror is formed from matched transistors Q2 and Q2dc where the current from transistor Q2, $i_d$, tracks the current in transistor Q2dc, which in turn is the current from NMOS FET Q1. Similarly, a 1:1 current mirror is also formed from matched transistors Q2D and Q2Ddc where the current from transistor Q2D, $i_d$, tracks the current in transistor Q2Ddc, which in turn is the current from NMOS FET Q1D. At the same time current $i_{R2}$, in high-voltage resistor R2, is a measure of the high-voltage power supply. Therefore, the difference between the current from resistor R2 and from the sum of transistors Q2dc plus Q2Ddc, or $(2xi_d)-i_2$, is an accurate measure of the input voltage on line 20. Since this difference current $((2xi_d)-i_2)$ is supplied by amplifier A9 via resistor $R_{fb}$, the output of the amplifier is also a measure of the input voltage, reflected in the figure as DC OUT. Thus, the high-voltage differential cascode NMOS FET pair in block 310 and associated current mirror systems Q2:Q2dc and Q2D:Q2Ddc have translated the high voltage input to a low voltage DC output at ground potential, while maintaining the very high input impedance required by ESVs. This has been achieved without any need for a low-voltage power supply floating at a voltage approximately equal to the electrostatic potential being measured. As an alternative, the current mirror may be replaced by circuits comprising appropriate operation amplifiers and resistors. However, such a substitution would introduce considerable complexity into the ESV circuits illustrated.

The non-contacting electrostatic voltmeter preferably includes, a modulator having vanes, or similar sensor occluding mechanisms, for example the modulator depicted in U.S. Pat. No. 5,212,451 to Werner, Jr., vibrating to modulate the signal received by sensor 200 of FIG. 1. As is commonly known for non-contacting ESVs, the signal from the sensor electrode is generated by physically modulating the capacitive coupling between the electrode and the surface, such as a photoreceptor. Numerous approaches are known to achieve the modulation of the capacitive coupling relationship. The preferred embodiment is the single-beam modulator described in U.S. Pat. No. 5,212,451 by Werner, Jr. The electrode modulation causes a modulated voltage to be generated between the gate and source of the NMOS field-effect transistor Q1, or across biasing resistor $R_{in}$ (approximately 100 MΩ) and protection component circuit 21. Also included in the preferred embodiment is a non-modulated sensor, reference numeral 201 in FIG. 1, which produces a non-modulated capacitively coupled signal, INPUT2. Sensor 201 comprises an electrode similar in dimensions to that of modulated sensor 200, except that the electrode is rigidly fixed to a housing of the ESV and does not vibrate in the manner of sensor 200. The non-modulated input signal is supplied to the high-voltage differential cascode MOS FET pair as illustrated in FIG. 5A, where INPUT2 is supplied to the gate of MOS FET Q1D to cancel any transients introduced by imperfect modulation.

The input modulation on the NMOS FET Q1 causes a modulation of its drain current which translates the modulation to ground potential (i.e., it serves as an AC signal level shifting element in block 300). For the level shifting element to function, the NMOS FET must always be on. Since the input is from a capacitively coupled modulator, DC biasing conditions from gate to source must be established. This could be accomplished by a suitable floating bias supply to establish the proper DC biasing between gate and source. However, a floating bias would be undesirable due to the need to generate a floating bias voltage supply and to "zero out" or remove the error introduced by this bias voltage. By designing the NMOS FET to be "slightly" depletion mode, that is, when $V_{gs}$ is equal to zero volts it has a small amount of current passing through it, thereby making it "active," with no DC voltage between gate and source. The need for a bias voltage is thereby eliminated and DC biasing is accomplished by a single high value resistor, $R_{in}$ from gate to source in parallel with the protection circuit component 21, as illustrated in FIG. 5. The modulated drain current is then fed into respective current mirrors via transistors Q2 and Q2A of FIG. 5.

In accordance with the present invention a preferred embodiment employs cascode logic to shunt large changes in the DC current produced by variations in the input voltage, thereby significantly reducing the effect of the transient behavior of available NMOS FETs. As was shown by FIGS. 2, 3 and 4, conditioning circuit 310 may form a cascode amplifier, a differential amplifier, or preferably a differential cascode amplifier as illustrated in FIG. 4, when combined with Q1. Recognizing that an FET such as Q1 has a gate-to-drain capacitance, transient direct current is generated whenever there is a variation in the input voltage on line 20, as a result of the necessarily high input resistance of the modulator. As the feedback current, $I_c$, of FIG. 5 drives the voltage across Q1 through its range, the changing voltage results in a transient DC signal through what is illustrated as a drain-to-gate capacitor ($C_{dg}$) associated with Q1, where the "capacitor" is depicted in outline form to represent the internal capacitance of the Q1 FET. The transient current signal generated through $C_{dg}$ causes a significant drop across input resistor $R_{in}$, which, in turn, generates a transient DC output, where the DC output overdrives the subsequent amplifier stages in the circuit schematic illustrated in FIGS. 5A and 5B.

The cascode configurations of the input conditioning circuitry illustrated in block 310 of FIG. 5A resolve the transient DC output problem by shunting the large changing current across $C_{dg}$ of Q1 into the common substrate of the FET and by coupling the gate of the differential FET Q1D to the surface in a non-modulated manner. In operation, the cascode circuit holds the voltage across Q1 essentially constant so that the current through $C_{dg}$ is essentially zero, thereby eliminating the generation of a voltage potential across $R_{in}$. AS shown in FIG. 2, FET Q1C, which is preferably a high-voltage NMOS device having characteristics comparable to those previously described with respect to Q1, is included in the circuit to form a cascode when combined with Q1. More specifically, the source of Q1C is connected to the drain of Q1 and the gate of Q1C is connected to the substrate common, depicted in the figure as line 18.

Alternatively, and preferably, as illustrated by the differential cascode circuit of FIG. 5A, the cascode system will block the transient DC current via the gate-to-drain capacitance. In the differential cascode embodiment, equal changes in the DC components of the drain currents for FETs Q1 and Q1D are generated. Thus with the simple current mirror systems comprised of transistors Q2:Q2ac, Q2d:Q2C)ac, and QS:Q5A, the transient currents may be subtracted from one another, leaving only the resulting AC signal from the modulation as represented by the signal at node D. It is noted that the preferred differential cascode configuration for input signal conditioning circuit 250 produces two significant advantages over alternative configurations. First, changes in current $I_d$ resulting from changes in the drain-to-source voltage are canceled out. Second, there is no net direct current flowing through the sensing resistor (not shown), so that the bias voltage of the output signal is controlled solely by the bias on opamp A9, not the resistance of the sensing resistor or the level of $I_d$.

The gain, demodulation, and integration block 524 in FIG. 1 is implemented using well-known operational amplifier circuits illustrated in more detail in FIG. 5B. The gain stage is also enhanced using a dynamically limited amplifier A1 similar to that disclosed in U.S. Pat. No. 5,204,636 to Werner et al.. The DC feedback is generated by the high-voltage PNP transistor Q4 of FIG. 5B which is coupled to the output of the integration stage. As described previously, the collector current feeds resistor R1 of the high-voltage level shifting circuit in order to supply DC feedback to drive the source-gate potential of Q1 to match the electrostatic potential on the surface. This current is also mirrored into the transimpedance amplifier of block 400 by a current mirror system so that the output voltage is accurately generated. In practice, implementation would be more complex, in that it would account for the base current of the transistors using techniques well known to those skilled in the art.

Also reflected in FIGS. 5A and 5B is the use of a medium voltage bus (MV) having a potential of approximately 24 volts. Output HV driver Q4, a high-voltage PNP bipolar transistor, has its positive compliance extended via the use of medium voltage FETs enabled by the MV buss. The performance improvement resulting from the additional voltage are preferred as it extends the positive measurement range of the non-contacting ESV.

In recapitulation, the present invention is an electrostatic voltmeter suitable for use in a non-contacting, positive or negative potential sensing, type electrostatic voltmeter. The invention enables a flexible, low cost electrostatic voltmeter to be produced using a high-voltage field-effect transistor in the circuit design. The invention further includes input conditioning components that enable high-voltage sensing and high-voltage feedback in such a manner that processing of the input signal from the sensor is accomplished without producing a variation in the current passing through the field-effect transistor in response to voltage variations. Elimination of this variation further reduces the susceptibility of the remaining signal processing circuitry in the electrostatic voltmeter to transient direct-current signals.

It is, therefore, apparent that there has been provided, in accordance with the present invention, an apparatus for efficiently and reliably producing a signal representative of the potential of an electrostatic field on an insulating surface. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. An apparatus for generating a low voltage signal proportional to an electrostatic potential on a surface, comprising:

a non-contacting sensor for producing an input signal representative of the electrostatic potential on the surface;

a high-voltage source adapted to produce a first potential of first polarity;

a high-voltage level shifting circuit, powered by said high-voltage source and including an input conditioning circuit for reducing transient variations in the input signal produced by said sensor, said high-voltage level shifting means generating a first signal referenced to ground in response to the conditioned input signal output from the input signal conditioning circuit; and a circuit, connected to receive the first signal from said high-voltage level shifting means, for converting the first signal to a low voltage signal, said low voltage signal being referenced to ground potential.

2. The apparatus of claim 1, wherein said high-voltage level shifting means includes an input transistor and where said input signal conditioning circuit comprises an output transistor operating in conjunction with said input transistor to form a differential amplifier circuit.

3. The apparatus of claim 2, wherein said high-voltage level shifting means includes an input transistor and where said input signal conditioning circuit comprises three transistors forming, in conjunction with said input transistor, a differential cascode amplifier.

4. The apparatus of claim 3, wherein said differential cascode amplifier includes a pair of matched high-voltage MOS FET transistors and a pair of differential transistors.

5. The apparatus of claim 1, wherein said high-voltage level shifting means includes an input transistor and where said input signal conditioning circuit comprises means for shunting a large changing current into a common substrate node of the input transistor.

6. The apparatus of claim 5, wherein said means for shunting a large changing current comprises an output transistor operating in conjunction with said input transistor to form a cascode amplifier circuit.

7. The apparatus of claim 6, wherein said cascode amplifier circuit further includes a substrate common connected to the gate of said output transistor.

8. The apparatus of claim 5, wherein said means for shunting a large changing current includes an input transistor and where said input signal conditioning circuit comprises an output transistor operating in conjunction with said input transistor to form a cascode amplifier circuit, said cascode circuit including a differential cascode.

9. The apparatus of claim 4, wherein said input transistor is one of said pair of differential transistors and where said non-contacting sensor includes:

a modulated sensor, capacitively coupled with the surface, for producing a modulated input signal, said modulated input signal being supplied to the a gate of the input transistor; and a non-modulated sensor, capacitively coupled with the surface, for producing a non-modulated input signal, said non-modulated input signal being supplied to the a gate of a second of said pair of differential transistors.

10. The apparatus of claim 4, wherein said matched high-voltage MOS FET transistors each are high-voltage depletion-mode NMOS drivers operating over a range of 0 volts to 1700 volts.

11. The apparatus of claim 1, wherein the surface is a photoresponsive surface.

12. The apparatus of claim 11, wherein the apparatus is adapted to provide low voltage input signals as an input to xerographic process control system.

* * * * *